(12) United States Patent
Zhang et al.

(10) Patent No.: US 8,380,157 B2
(45) Date of Patent: Feb. 19, 2013

(54) UP-CONVERSION MIXER WITH SIGNAL PROCESSING

(75) Inventors: Zisan Zhang, Villach (AT); Dieter Draxelmayr, Villach (AT)

(73) Assignee: Infineon Technologies AG, Neubiberg (DE)

( * ) Notice: Subject to any disclaimer, the term of this patent is extended or adjusted under 35 U.S.C. 154(b) by 1028 days.

(21) Appl. No.: 12/186,045

(22) Filed: Aug. 5, 2008

(65) Prior Publication Data
US 2010/0035571 A1    Feb. 11, 2010

(51) Int. Cl.
*H04B 1/26* (2006.01)
*H03F 3/04* (2006.01)

(52) U.S. Cl. .......................... 455/323; 455/313; 330/288

(58) Field of Classification Search ................. 455/326, 455/127.1, 189.1, 293, 144, 341, 323, 190.1, 455/313; 330/285, 288, 10
See application file for complete search history.

(56) References Cited

U.S. PATENT DOCUMENTS

| 4,361,816 | A  | * | 11/1982 | Schade, Jr. ................ 330/288 |
| 6,778,117 | B1 | * | 8/2004  | Johnson .................... 341/144 |
| 6,909,292 | B1 | * | 6/2005  | Kavadias ................... 324/601 |
| 7,187,909 | B2 | * | 3/2007  | Lin et al. .................. 455/91 |
| 7,724,079 | B1 | * | 5/2010  | Shumarayev ................ 330/9 |

FOREIGN PATENT DOCUMENTS

DE       19958049 A1    6/2000

* cited by examiner

*Primary Examiner* — Sonny Trinh
(74) *Attorney, Agent, or Firm* — SpryIP, LLC

(57) ABSTRACT

Systems and methods for implementing an up-conversion mixer with signal processing are disclosed.

22 Claims, 8 Drawing Sheets

UP-CONVERSION MIXER WITH SIGNAL PROCESSING

BACKGROUND

In typical wireless communication systems such as Ultra Wide-Band (UWB), wireless local area network (WLAN), etc, a baseband signal undergoes processing and mixing with a local oscillator signal for up-conversion of the baseband signal into a radio frequency (RF) signal. In traditional implementations, up-conversion of the baseband signal to the RF signal takes place in the current domain, however, signal processing, such as amplification and filtering, takes place in the voltage domain. In addition, interfaces between signal processing blocks and mixing blocks are also in the voltage domain in classical RF transmitters. Therefore, conversions of the baseband signal from the voltage domain to the current domain and vice versa usually take place several times. This can increase noise, chip area and power consumption substantially.

Recently, more and more RF transceivers used in the wireless communication systems have Very Large Scale Integration (VLSI) or even System-on-Chip (SoC) level integration, and they support multi-band and/or multi-standard operation. The signal processing blocks and multiple RF frontend blocks including mixers are integrated in a VLSI Integrated Circuit (IC). In most cases, multiple RF frontend blocks occupy a large area, and the signal processing blocks may need to be appropriately separated from the RF frontend blocks for proper floor planning. As a result, the signal processing block delivers a signal to the RF block via long wirings. The passage of the signal via long wirings can couple noises to the interface nodes, and cause high consumption of power for driving parasitic load of the long wirings.

BRIEF DESCRIPTION OF THE DRAWINGS

The detailed description is described with reference to accompanying figures. In the figures, the left-most digit(s) of a reference number identifies the figure in which the reference number first appears. The same numbers are used throughout the drawings to reference like features and components.

DETAILED DESCRIPTION

Disclosed are techniques for implementing an up-conversion mixer with signal processing capabilities. The up-conversion mixer with signal processing capabilities can be included in the radio frequency (RF) transmission section of communication devices, such as cellular telephones. The disclosed techniques can also be used for both integrated circuit (IC) level design and printed circuit board (PCB) level designs to reduce noise coupling, chip area, power consumption and the number of components employed in a circuit.

The up-conversion mixer processes a baseband signal, in addition to converting the baseband signal into an RF signal. The baseband signal is converted into a corresponding current signal, and the resulting current signal is then processed. The processing of the baseband signal includes amplification and filtering of the baseband current signal. The up-conversion mixer works on the principle of current commutating mixer together with signal processing in the current domain. After processing, the baseband signal is modulated with a local oscillator (LO) signal and converted up to an RF voltage signal.

The up-conversion mixer can include signal processing components on the chip itself, saving chip area, lowering power consumption and providing more flexibility in floor planning. Furthermore, interface nodes between different components are in current domain and are not as sensitive as components in the voltage domain. Factors such as noise coupling and parasitic load effects from long wirings also have less influence on the circuitry.

Exemplary Systems

The order in which blocks of systems in the following description of exemplary block diagrams are described is not intended to be construed as a limitation, and any number of the described system blocks can be combined in any order to implement the systems, or alternate systems. Additionally, individual blocks may be deleted from the systems without departing from the spirit and scope of the subject matter described herein. Furthermore, the systems can be implemented in any suitable hardware in IC level or PCB level without departing from the scope of the invention.

Figure 1:
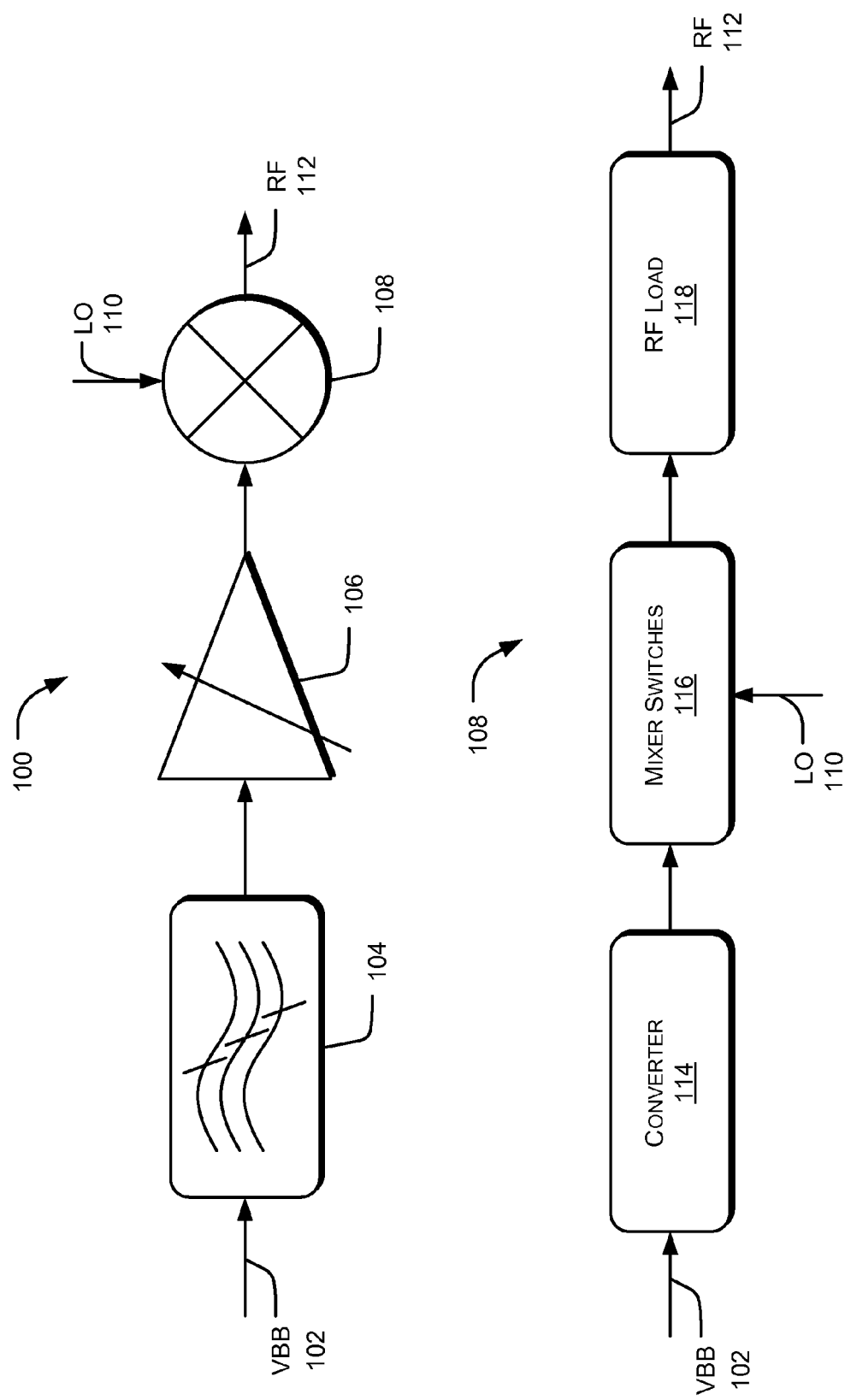
FIG. 1 are exemplary block diagrams illustrating a transmission section and an up-conversion mixer in a communication device.

FIG. 1 illustrates an RF transmitter section 100 of a communication device. The RF transmitter section 100 receives a baseband signal 102, referred to as VBB signal, from an input source such as baseband processing unit. The RF transmitter section 100 includes signal processing blocks such as a filter 104 and a programmable gain amplifier 106, and an up-conversion mixer 108. The filter 104 and the programmable gain amplifier 106 process the VBB signal 102. The VBB signal 102 is then mixed in the up-conversion mixer 108 with a Local Oscillator (LO) signal 110 to produce an RF signal 112, referred to as RF signal.

FIG. 1 further illustrates a typical up-conversion mixer. The up-conversion mixer 108 may be a current commutating mixer such as a Gilbert-cell mixer. The up-conversion mixer 108 includes a converter 114 that converts the VBB signal 102 into a current signal. Converter 114 may include a Digital to Analog Converter (DAC), in particular a current steering DAC, a programmable transconductor, or any circuit that converts the VBB signal into a current signal. The baseband current signal is then converted into the RF signal in current domain. The conversion is performed via a mixer switches 116, which receives the LO signal 110. The mixer switches 116 may include any suitable circuits, such as a switching quad circuit. The RF current signal is then converted into the voltage domain with the help of an RF load 118.

Figure 2:
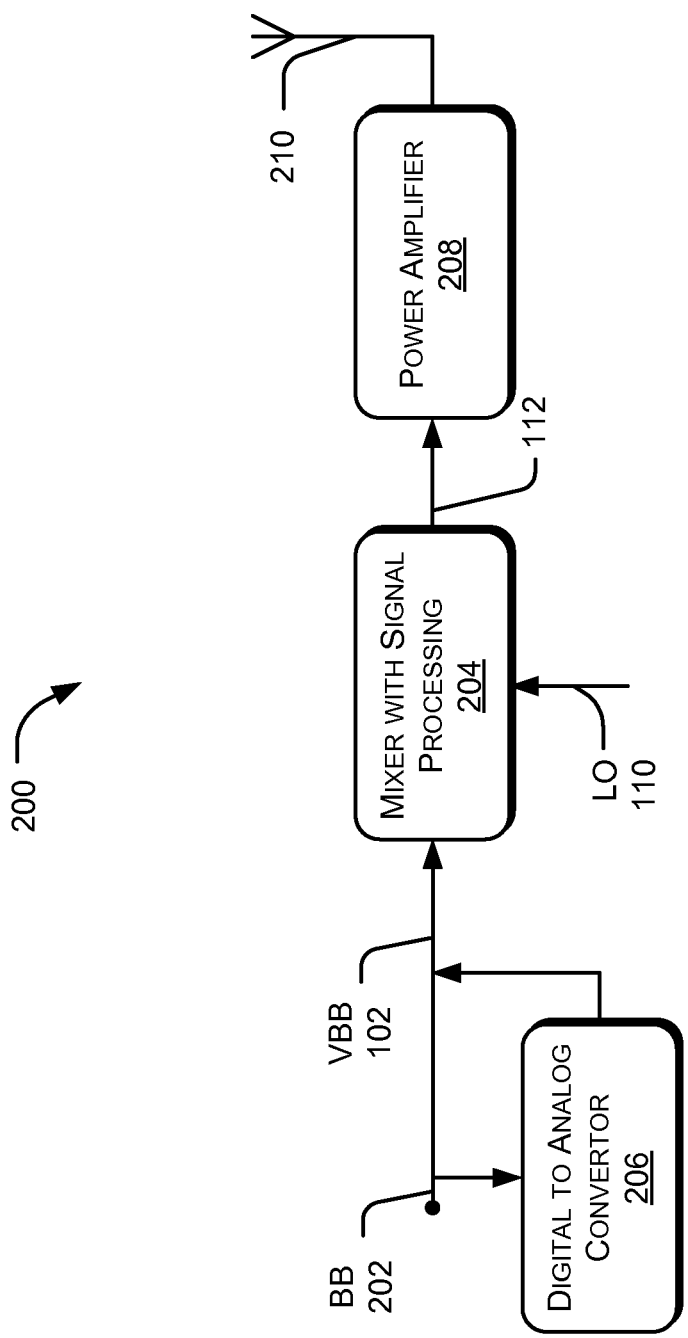
FIG. 2 is a block diagram illustrating of an exemplary transmission section of a communication device with an up-conversion mixer having signal processing capabilities.

FIG. 2 illustrates the transmission section 200 of a wireless communication device. The transmission section 200 receives a baseband input signal (BB) 202.

In one implementation, the BB signal 202 can be an audio signal, video signal, data stream, etc. The input signal 202 can be received from an electronic device such as a microphone, a computing device, etc. If the BB signal 202 is in analog format, referred to as VBB signal 102, it is directly fed to a mixer with signal processing 204, referred to as mixer 204, hereinafter.

In one implementation, if the BB signal 202 is in digital format, it is converted to an analog signal before any further processing. A digital-to-analog convertor (DAC) 206 converts the BB signal 204 into a corresponding analog signal. The DAC 206 can be any type of digital-to-analog converter known in the art. The converted BB signal 202 is referred to as voltage baseband signal or VBB signal 102. The VBB signal 102 is then fed to mixer 204. In an implementation, if DAC 206 provides a current output, voltage to current conversion (e.g., implementation with programmable transconductor) may be performed in a subsequent stage. In such an implementation, processing or filtering may be performed without voltage to current and current to voltage conversion in between stages.

The mixer 204 modulates the VBB signal 102 into an RF signal. In one implementation, the mixer 204 can be an up-conversion mixer with signal processing capabilities. The mixer 204 converts the VBB signal 102 into a current signal before processing the VBB signal 102. The mixer 204 includes one or more current amplifiers and current-mode filters to amplify and filter the current signal. After amplifying and filtering of the current signal, the mixer 204 modulates the current signal into an RF current signal using the LO signal 110. The RF current signal is converted to an RF voltage signal, referred to as RF signal 112, via an RF load.

The RF signal 112 is further fed to a power amplifier 208. The power amplifier 208 amplifies and increases the output power of the RF signal 112. The RF signal 112 is then transmitted via an antenna 210.

Figure 3:
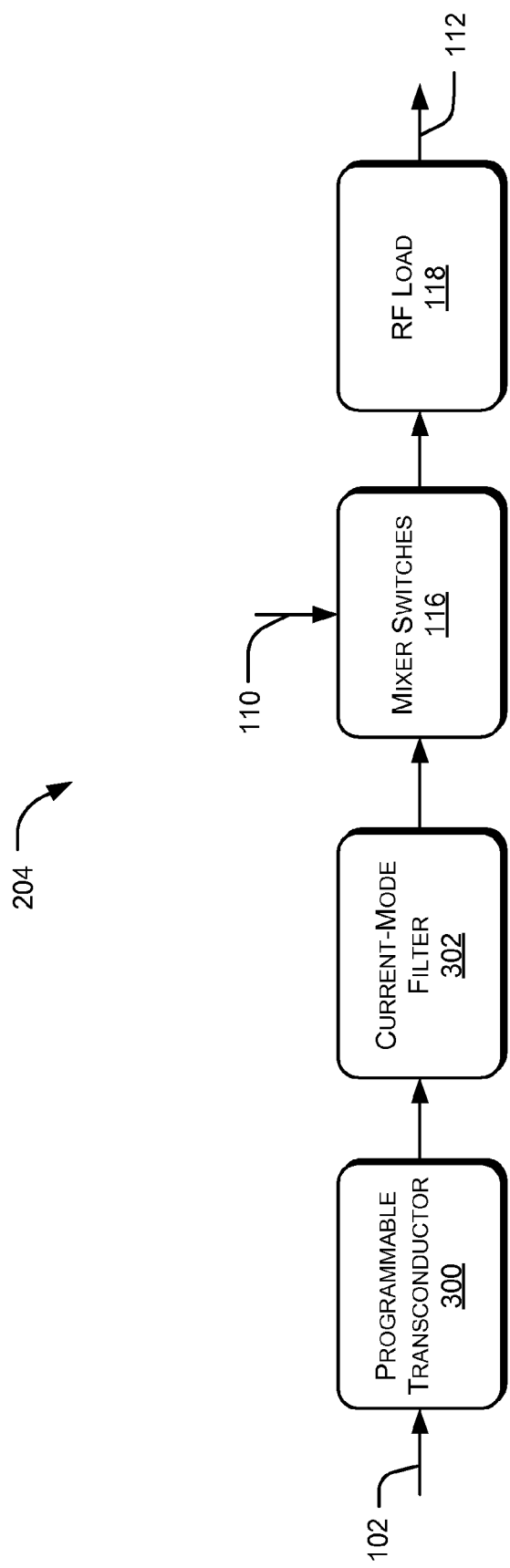
FIG. 3 is a block diagram illustrating an exemplary high voltage version of an up-conversion mixer with signal processing capabilities.

FIG. 3 illustrates an exemplary high voltage version of a mixer with signal processing. In the following description, the components common with the previous figures have been referred to by the same names and numerals.

The VBB signal 102 received from an input source feeds a programmable transconductor 300. The programmable transconductor 300 converts the VBB signal 102 into a current signal. The transconductance of the programmable transconductor 300 can be adjusted to obtain a required voltage-to-current conversion ratio. In one embodiment, a differential amplifier with a variable resistor can be used as the programmable transconductor 300. The current signal generated by the programmable transconductor 300 is then fed to a current-mode filter 302.

The current-mode filter 302 can be an electronic filter that filters a current signal to remove noise or unwanted signals from the current signal. The current-mode filter 302 can be either an active filter or a passive filter. In one implementation, the current-mode filter can be implemented using an intrinsic second order filter from a regulated cascode, known in the art. The filtered current signal is then fed to the mixer switches 116.

At the mixer switches 116, the current signal is mixed with the LO signal 110 to generate an RF signal in the current domain. The mixer switches 116 receives the LO signal 110, and modulates the current signal in accordance with the LO signal 110. The LO signal 110 can be generated by a LO generation block (not shown). The mixer switches 116 can be implemented using two cross-coupled differential pairs. The RF current signal thus obtained is then sent to the RF load 118. The RF load 118 converts the RF current signal into the RF voltage signal 112. The RF load 118 can be either a resistive load, an inductive load, or a complex load such as a resonator.

Figure 4:
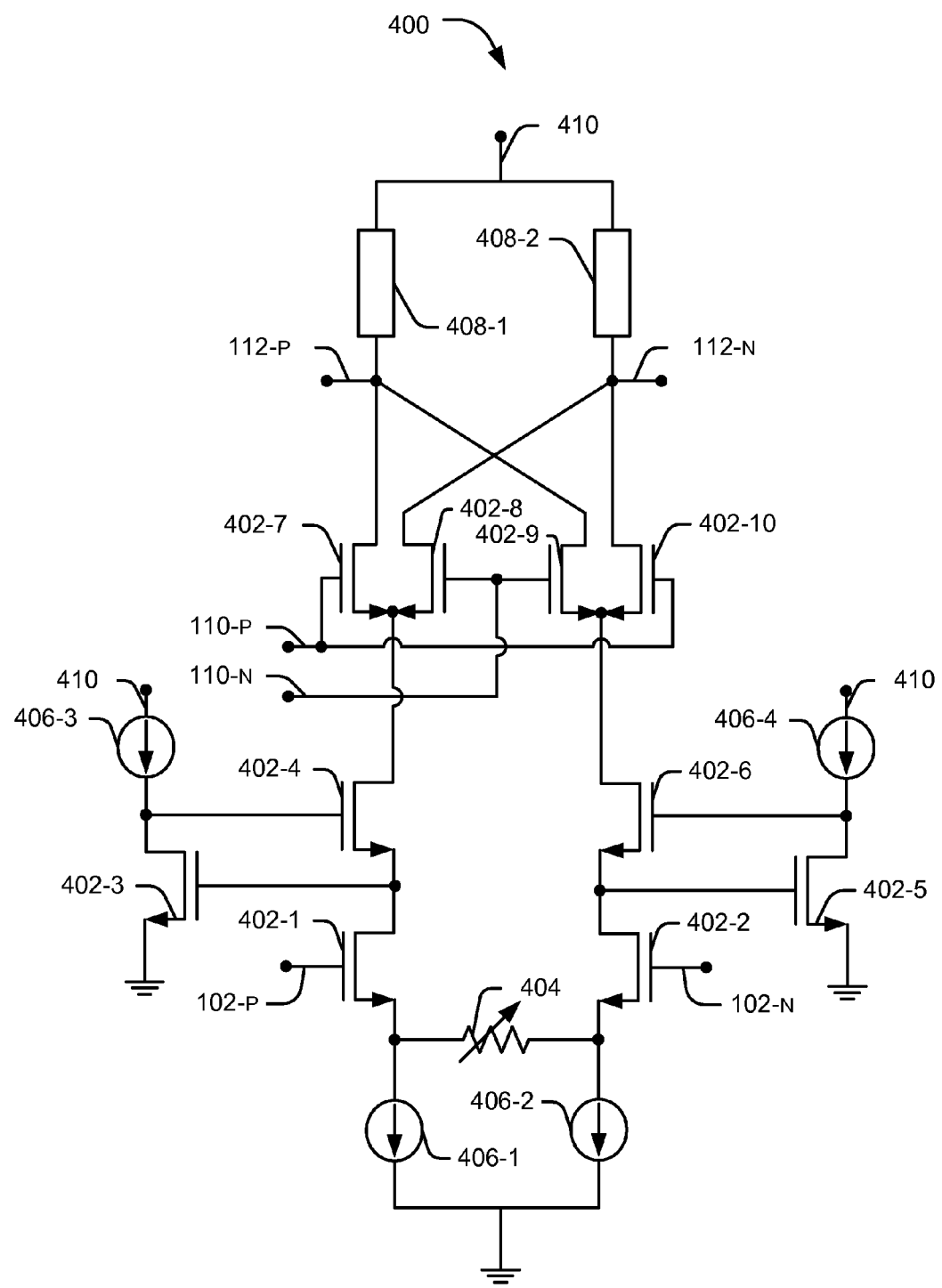
FIG. 4 is a circuit diagram illustrating an exemplary high voltage version of an up-conversion mixer with signal processing capabilities.

FIG. 4 illustrates an exemplary circuit 400 for a high voltage version of the mixer 204. The circuit diagram is intended to explain the concept for the high voltage version of the mixer 204 at an elementary level, and the number and the type of electronic components depicted in the circuit diagram does not limit the realization of the mixer 204. In the following description, the components common with the previous figures have been referred to by the same names and numerals.

The circuit 400 for a high voltage version of the mixer 204 includes electronic components such as transistors, current sources, resistors, voltage supply, etc. In one implementation, for the high voltage version, power supply voltage is able to support four or more stacked transistors and/or resistors between power supply rails.

The circuit 400 includes a programmable transconductor implemented via a differential pair realized with n-channel MOSFETs 402-1 and 402-2, referred to as nMOS 402-1 and 402-2 hereinafter, a variable resistor 404, and current sources 406-1 and 406-2. In an implementation, other type of transistors, such as bipolar junction transistors (BJT), can also be used in place of the MOSFETs. The differential amplifier receives the VBB signal 102 as an input at the gate terminals of the nMOS 402-1 and 402-2. The nMOS 402-1 receives the VBB signal 102 with positive polarity, referred to as VBB+ signal 102-P, while the nMOS 402-2 receives the VBB signal 102 with negative polarity, referred to as VBB− signal 102-N.

The differential pair converts the VBB+ signal 102-P and the VBB− signal 102-N into corresponding current signals. The variable resistor 404 connected at the source terminals of the nMOS 402-1 and 402-2 can be adjusted to increase or decrease the effective transconductance of the voltage-to-current convertor. In an alternate embodiment, a transistor or a switchable resistor array can be used in place of the variable resistor 404. In certain implementations, a fixed resistor may be implemented in place of variable resistor 404. The current signals are then fed as input to the current-mode filters 302.

The current-mode filters 302 filter the current signals to remove noise or unwanted signals. Active or passive current-mode filter known in the art can be used for filtering the current signals. In an implementation, the current-mode filters can be implemented using current-mode bi-quad filters realized using n-channel MOSFETs 402-3 to 402-6 and current sources 406-3 and 406-4 as shown. The current-mode filters 302 are explained in detail below. The filtered current signals are subsequently fed to the mixer switches 116.

The switching quad 116 modulates the current signals to an RF current signal with the help of the LO signal 110. In one implementation, two cross-coupled differential pairs act as the mixer switches 116. The differential pairs can be realized using n-channel MOSFETs 402-7 to 402-10. In an alternate embodiment, other types of transistors, such as BJT, can also be used to realize a differential pair. The source terminals of the nMOS 402-7 and 402-10 receive the current signals. The gate terminals to the nMOS 402-7 and 402-10 receive the LO signal 110 with positive polarity, referred to as LO+ signal 110-P, while the gate terminals to the nMOS 402-8 and 402-9 receive the LO signal 110 with negative polarity, referred to as LO− signal 110-N.

The nMOS 402-7 to 402-10 form a multiplication function, multiplying the baseband signals from nMOS 402-1 and 402-2 with the LO signal 110. The nMOS pair of 402-7 and 402-9 switches between the nMOS pair 402-8 and 402-10, to provide an RF current signal with positive polarity to an RF load 408-1, or provide an RF current signal with negative polarity to an RF load 408-2.

The RF loads 408-1 and 408-2, collectively referred to as RF load 408, implement the RF load 118 and convert the RF current signals to the RF voltage signals RF 112-P and RF 112-N, respectively. In one implementation, the RF load 408 can be either a resistive load, an inductive load, or a complex load such as a resonator.

The electronic components and the current sources in the circuit 400 are supplied power via a power supply voltage 410. The power supply voltage 410 can be received from a DC supply derived from a battery or other DC source.

Figure 5:
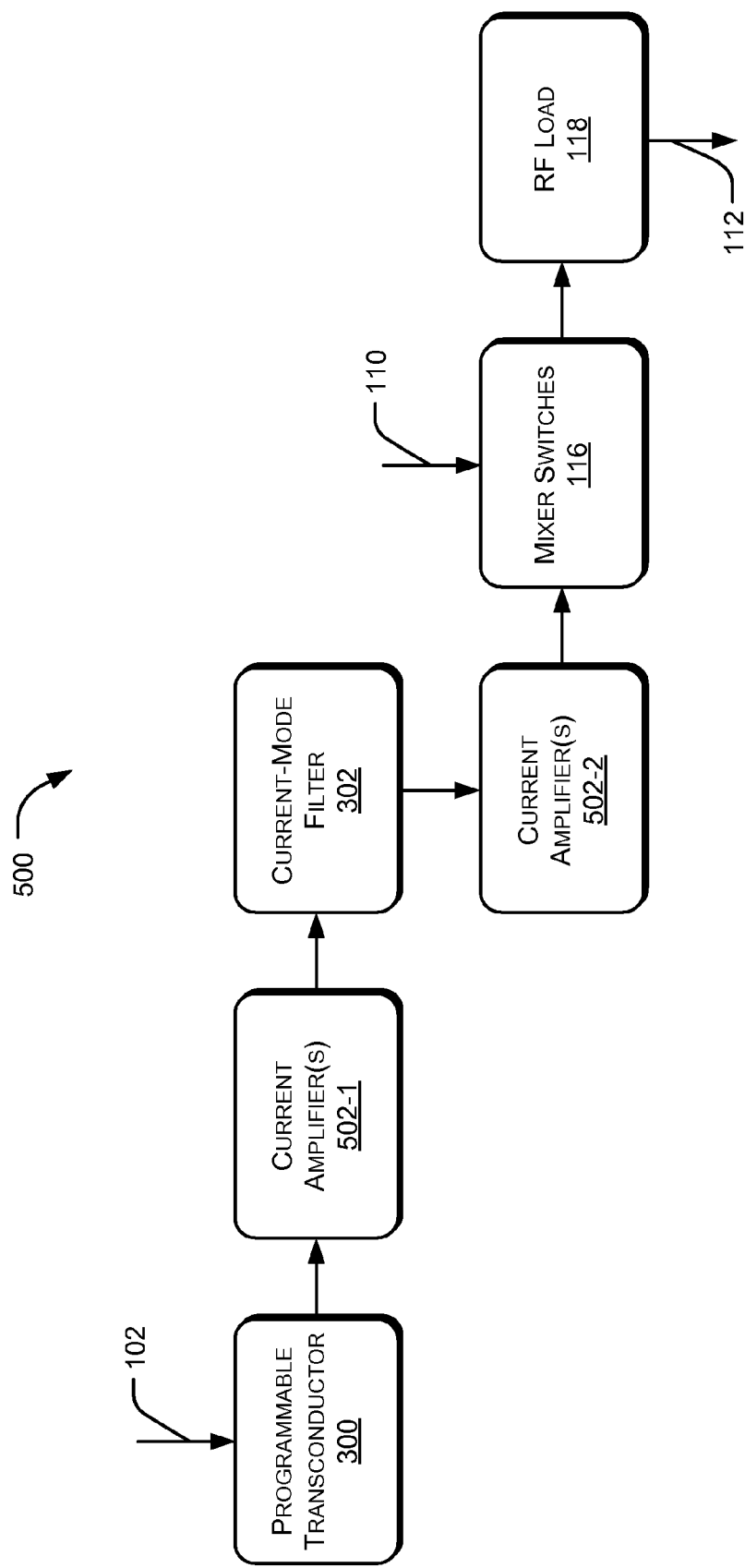
FIG. 5 is a block diagram illustrating an exemplary low voltage version of an up-conversion mixer with signal processing capabilities.

FIG. 5 illustrates an implementation of a low voltage version of the mixer 204. In the following description, the components common with the previous figures have been referred to by the same names and numerals.

The VBB signal 102, received from an input source, feeds the programmable transconductor 300. The programmable transconductor 300 amplifies and converts the VBB signal 102 into a current signal. The effective transconductance of the programmable transconductor 300 can be adjusted to obtain the required voltage-to-current conversion ratio. A differential pair with a variable source degeneration resistor can be used as the programmable transconductor 300. The current signal is then fed to one or more current amplifier(s) 502-1.

The current amplifier(s) 502-1 provides amplification to the current signal as needed. Current mirrors can be used for implementing the current amplifier(s) 502-1. In an alternate embodiment, current-feedback operational amplifiers can be used as current amplifier(s) 502-1. The amplified current signal can then be fed to the current-mode filter 302.

The current-mode filter 302 can be an electronic filter that filters a current signal to remove noise or any unwanted signals from the current signal. The current-mode filter 302 can be either an active filter or a passive filter. In one implementation, the current-mode filter can be implemented using an intrinsic second order filter from a regulated cascode. The filtered current signal can be further amplified using one or more current amplifier(s) 502-2. Thereafter, the current signal is fed to the mixer switches 116.

At the mixer switches 116, the baseband signal is mixed with the local oscillator signal (LO) 110 to generate an RF current signal. The mixer switches 116 receives the LO signal 110 and modulates the current signal in accordance with the LO signal 110. The LO signal 110 can be generated by a local oscillator (LO) generation block. The mixer switches 116 can be implemented using two cross-coupled differential pairs. The RF current signal thus generated is then sent to an RF load 118. The RF load 118 converts the RF current signal to the RF voltage signal 112. The RF load 118 can be either a resistive load or an inductive load.

Figure 6:
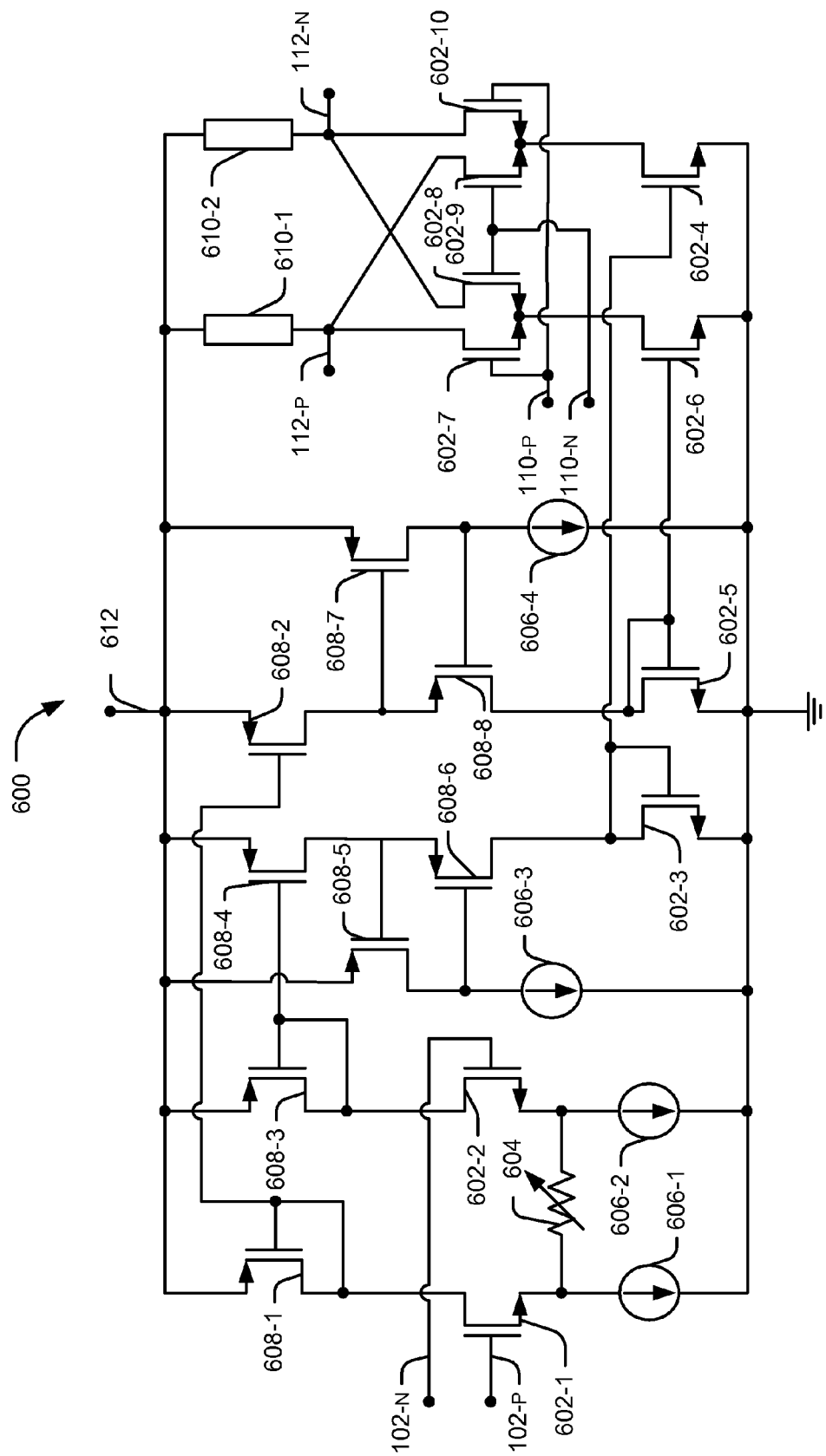
FIG. 6 is a circuit diagram illustrating an exemplary low voltage version of an up-conversion mixer with signal processing capabilities.

FIG. 6 illustrates an exemplary circuit 600 for a low voltage version of the mixer 204. The circuit diagram is intended to explain the concept for the low voltage version of the mixer 204 at an elementary level and the number and type of electronic components depicted in the circuit diagram does not limit the realization of the mixer 204. In the following description, the components common with the previous figures are referred to by the same names and numerals.

The circuit 600 for a low voltage version of the mixer 204 includes electronic components such as transistors, current sources, resistors, voltage supply, etc. In an implementation, for the low voltage version, the power supply voltage is only able to support maximum three stacked transistors between the power supply rails.

In the circuit 600, the programmable transconductor 300 is implemented via a differential pair realized with the help of n-channel MOSFETs 602-1 and 602-2, referred to as nMOS 602-1 and 602-1 hereinafter, a variable resistor 604 (in certain implementations a fixed resistor may be used), and current sources 606-1 and 606-2. In an implementation, any other type of transistors, such as BJT, can also be used in place of the MOSFETs. The VBB signal 102 is received as input at the gate terminals of the nMOS 602-1 and 602-2. The nMOS 602-1 receives the VBB signal 102 with positive polarity, referred to as VBB+ signal 102-P, while the nMOS 602-2 receives the VBB signal 102 with negative polarity, referred to as VBB− signal 102-N.

The differential pair converts the VBB+ signal 102-P and the VBB− signal 102-N into corresponding current signals. The variable resistor 604 connected at the source terminals of the nMOS 602-1 and 602-2 can be adjusted to increase or decrease the effective transconductance of the programmable transconductor. In an alternate embodiment, a transistor used as a variable resistor or a switchable resistor array can be used in place of the variable resistor 604. The current signals thus obtained are then fed to one or more current amplifier(s) 502-1.

The current amplifier(s) 502-1 can be realized using programmable current mirrors or current-feedback operational amplifiers. In one implementation, the current signal received from the nMOS 602-1 can be fed to a current mirror realized with the help of transistors pMOS 608-1 and 608-2. The current signal from the nMOS 602-2 can then be fed to a current mirror realized with transistors pMOS 608-3 and 608-4. The current mirrors amplify the input current signals depending upon the current mirror ratio of the current mirrors pMOS 608-1 to 608-2 and pMOS 608-3 to 608-4. In an alternate embodiment, nMOS current mirrors can be used in place of pMOS current mirrors. After amplification, the current signals can be fed to the current-mode filters 302.

In an implementation, the current-mode filters 302 can be implemented using current-mode bi-quad filters realized using p-channel MOSFETs 608-5 to 608-8 and current sources 606-3 and 606-4. The current-mode filters 302 filter the current signals to remove noise or unwanted signals. Active or passive current-mode filter known in the art can be used for filtering the current signals. The current mode filters are explained further below. The filtered current signals can be amplified further using one or more current amplifiers 502-2.

In an implementation, the filtered current signals are fed to current mirrors realized with the help of transistors pMOS 608-5 to 608-8. The amplified current signals can then be fed to the mixer switches 116.

In one implementation, two cross-coupled differential pairs with conjoined gate terminals act as the mixer switches 116. The differential pairs can be realized using n-channel MOSFETs 602-7 to 602-10. In an alternate embodiment, other type of transistors, such as BJT, can also be used to realize a differential pair. The source terminals of nMOS 602-7 to 602-10 receive the current signals. The gate terminals to the nMOS 602-7 and 602-10 receive the LO signal 110 with positive polarity, referred to as the LO+ signal 110-P, while the gate terminals to the nMOS 602-8 and 602-9 receive the LO signal 110 with negative polarity, referred to as the LO− signal 110-N.

The nMOS 602-7 to 602-10 form a multiplication function, multiplying the baseband signal with the LO signal 110. The nMOS pair 602-7 and 602-10 switches between the nMOS pair 602-8 and 602-9 to provide an RF current signal with positive polarity to an RF load 610-1, or to provide an RF current signal with negative polarity to an RF load 610-2. Therefore, the current signals are modulated to RF current signals with the use of the local oscillator signal LO 110, and the RF current signals are then sent to the RF loads 610.

At the RF loads 610-1 and 610-2, collectively referred as RF load 610, the RF current signals are converted to the RF voltage signals RF 112-P and RF 112-N, respectively. In one implementation, the RF load 610 can be either a resistive load or an inductive load.

The electronic components and the current sources in the circuit 600 are supplied power via a power supply voltage 612. The power supply voltage 612 can be obtained from a DC supply derived from a battery or other DC source.

Figure 7:
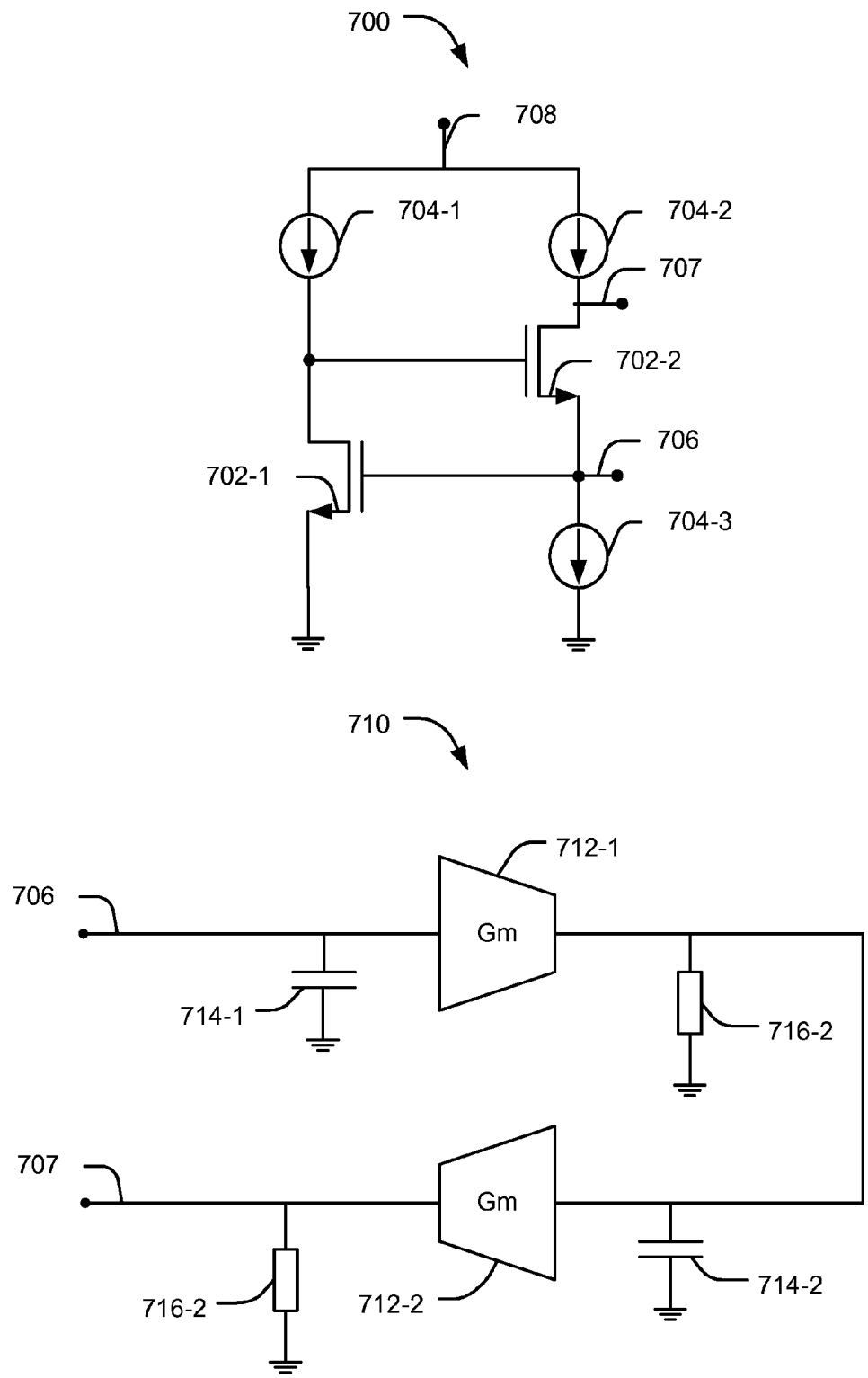
FIG. 7 are circuit diagrams illustrating exemplary of current-mode filters.

FIG. 7 illustrates an exemplary implementation of the current-mode filter 302. In one implementation, the current-mode filter 302 can be implemented by a current mode bi-quad filter 700. The current mode bi-quad filter 700 can be realized using n-channel MOSFET(s) 702-1 and 702-2, referred to as nMOS 702-1 and 702-2 hereinafter, and current sources 704-1, 704-2 and 704-3. A current signal 706 can be fed at the gate terminal of the nMOS 702-1. The current mode bi-quad filter 700 can be a second order low-pass filter using the nMOS 702-1 and 702-2 with parasitic gate to source capacitance, in other implementations, high quality linear capacitors can be used. The baseband current signal 706 can thereby be filtered in the current domain, thus producing a filtered signal 707.

The electronic components and the current sources in the circuit 700 are supplied power via a power supply voltage 708. The power supply voltage 708 can be a DC supply derived from a battery or other DC source.

FIG. 7 shows another exemplary implementation of the current-mode filter 302. The current mode filter 302 can be implemented as a filter 710. The filter 710 can be realized with the use of operational transconductance amplifiers (OTA) 712-1 and 712-2; capacitor(s) 714-1 and 714-2; output resistances 716-1 and 716-2. The filter 710 filters the input current signal 706 in a manner similar to that described above with reference to circuit 700, thus producing the filtered signal 707.

Exemplary Method

Figure 8:
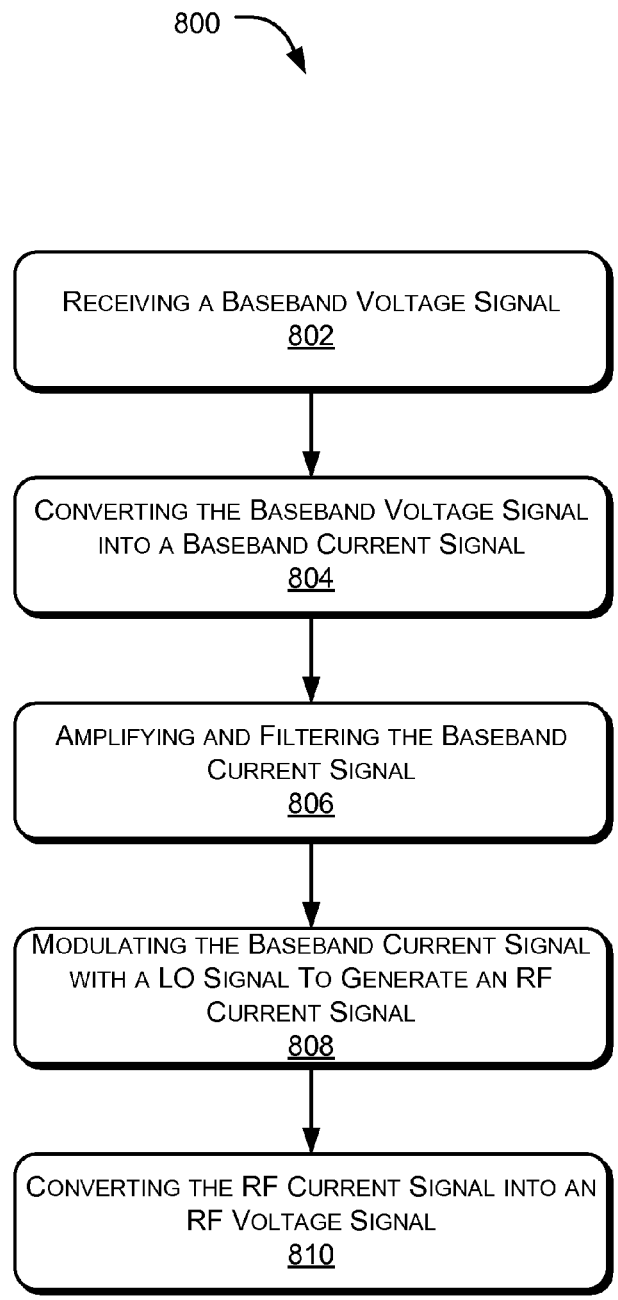
FIG. 8 is a flowchart of an exemplary method for implementing an up-conversion mixer with signal processing capabilities.

FIG. 8 illustrates an exemplary method for implementing an up-conversion mixer with signal processing. The order in which the method is described is not intended to be construed as a limitation, and any number of the described method blocks can be combined in any order to implement the method, or alternate method. Additionally, individual blocks may be deleted from the method without departing from the spirit and scope of the subject matter described herein.

At block 802, a baseband voltage signal is received as an input for up-conversion. In an implementation, the transmission section of a communication device, such as a cell phone, receives the input signal 202. The input signal 202 is processed and then fed to the up-conversion mixer 204 as the VBB signal 102. Thereafter, the VBB signal 102 is up-converted to an RF signal at the mixer 204.

At block 804, the baseband voltage signal is converted into a baseband current signal. In one implementation, the VBB signal 102 is converted into a current signal by the programmable transconductor 300 included in the mixer 204. The transconductance of the programmable transconductor 300 can be adjusted to get the required voltage-to-current conversion ratio. A differential pair with a variable resistor can be used as the programmable transconductor 300.

At block 806, the baseband current signal is amplified and filtered. In one implementation, the baseband current signal can be amplified using one or more current amplifiers. The current amplifier(s) 502-1 provides amplification to the baseband current signal as required. Current mirrors can be used for implementing the current amplifier(s) 502-1. In an alternate embodiment, current-feedback operational amplifiers can be used as current amplifier(s) 502-1. The amplified baseband current signal can then be fed to the current-mode filter 302.

The current-mode filter 302 can be an electronic filter that filters the baseband current signal to remove noise or any unwanted signals from the baseband current signal. The current-mode filter 302 can be either an active filter or a passive filter. In one implementation, the current-mode filter can be realized using an intrinsic second order filter from a regulated cascode, known in the art.

At block 808, the baseband current signal is modulated into an RF current signal. In one implementation, after amplification and filtering, the baseband current signal is fed to the mixer switches 116. At the mixer switches 116, the baseband current signal is mixed with the local oscillator signal LO 110 to generate an RF current signal. The switching quad 116 receives the LO signal 110 and modulates the baseband current signal in accordance with the LO signal 110. The LO signal 110 can be generated by a local oscillator (LO) generation block. The mixer switches 116 can be implemented using cross-coupled differential pairs.

At block 810, the RF current signal is converted into an RF voltage signal. In one implementation, the RF current signal is sent to the RF load 118 where it is converted into the RF voltage signal 112. The RF load 118 may be fixed or variable and may be implemented as a variable resistor, an inductor, or resonator.

CONCLUSION

Although embodiments for an up-conversion mixer with signal processing have been described in language specific to structural features and/or methods, it is to be understood that the appended claims are not necessarily limited to the specific features or methods described. Rather, the specific features and methods are disclosed as exemplary implementations for the up-conversion mixer with signal processing.

What is claimed is:

1. An up-conversion mixer with signal processing capabilities comprising:
    a converter that converts a baseband (BB) signal into a current signal;
    a current-mode filter that filters the current signal;
    mixer switches that receives the current signal, mixes the current signal with a local oscillator signal, and generates a radio frequency (RF) signal in current domain; and
    an RF load that converts the RF signal to a RF voltage signal.

2. The up-conversion mixer of claim 1, wherein the converter is a transconductor.

3. The up-conversion mixer of claim 1, wherein the converter is comprised of a differential pair with a programmable source degeneration resistor.

4. The up-conversion mixer of claim 1, wherein the converter is a Digital to Analog Circuit.

5. The up-conversion mixer of claim 1, wherein the current-mode filter filters noise from the current signal into a filtered signal.

6. The up-conversion mixer of claim 5, further comprising one or more current amplifiers that amplify the filtered signal.

7. The up-conversion mixer of claim 1, wherein the mixer switches are comprised of two cross-coupled differential pairs.

8. The up-conversion mixer of claim 1, wherein the local oscillator signal is generated by a local oscillator (LO) generation circuit.

9. The up-conversion mixer of claim 1, wherein the RF load is one of a resistive load, inductive load, or complex load.

10. The up-conversion mixer of claim 1, wherein current-mode filter includes a second order filter of a regulated cascode.

11. A device implementing an up-conversion mixer with signal processing capabilities comprising:
 a converter that converts a baseband (BB) signal into a BB current signal;
 a current-mode filter that filters the BB current signal; and
 a component that mixes the BB current signal with a local oscillator signal and converts that BB current signal to a voltage signal.

12. The device of claim 11, wherein the converter comprises a transconductance.

13. The device of claim 11, wherein the component is comprised of mixer switches that receive the BB current signal.

14. The device of claim 13, wherein the mixer switches is a switching quad that includes two cross-couple differential pairs.

15. The device of claim 11, wherein the component is comprised of one or more current-mode filters that filter noise from the BB current signal.

16. The device of claim 11, wherein the component is comprised of a programmable current gain block that modifies a signal strength of the BB current signal.

17. The device of claim 11, wherein the component is comprised of a RF load that converts that BB current signal to the voltage signal.

18. The device of claim 11, wherein the component is comprised of current-mode filter that is a second order filter of a regulated cascode.

19. A method of up-converting a baseband (BB) voltage signal with signal processing comprising:
 converting the BB voltage signal to a current signal;
 amplifying the current signal;
 modulating the current signal with a local oscillator signal to generate a radio frequency (RF) signal; and
 converting the RF signal to a RF voltage signal.

20. The method of claim 19, further comprising filtering the current signal.

21. The method of claim 20, wherein the act of filtering filters the current signal with a current-mode filter that is a second order filter of a regulated cascode.

22. The method of claim 19, further comprising processing the RF signal to a RF voltage signal.

* * * * *